United States Patent
Baillargeon et al.

[11] Patent Number: 6,055,257
[45] Date of Patent: Apr. 25, 2000

[54] QUANTUM CASCADE LASER

[75] Inventors: James Nelson Baillargeon, Springfield; Federico Capasso, Westfield; Alfred Yi Cho, Summit; Claire F. Gmachl, Short Hills; Deborah Lee Sivco, Warren, all of N.J.; Mattias Beck; Jerome Faist, both of Neuchatel, Switzerland

[73] Assignee: Lucent Technologies Inc., Murray Hill, N.J.

[21] Appl. No.: 09/067,086

[22] Filed: Apr. 27, 1998

[51] Int. Cl.$^7$ ............................................. H01S 3/19
[52] U.S. Cl. ........................... 372/46; 372/43; 372/45
[58] Field of Search ............................... 372/43–46

[56] References Cited

U.S. PATENT DOCUMENTS

| | | | |
|---|---|---|---|
| 4,660,208 | 4/1987 | Johnston et al. | 372/46 |
| 5,457,709 | 10/1995 | Capasso et al. | 372/45 |
| 5,502,787 | 3/1996 | Capasso et al. | 385/123 |
| 5,509,025 | 4/1996 | Capasso et al. | 372/45 |
| 5,570,386 | 10/1996 | Capasso et al. | 372/46 |
| 5,727,010 | 3/1998 | Capasso et al. | 372/45 |
| 5,745,516 | 4/1998 | Capasso et al. | 372/45 |

OTHER PUBLICATIONS

M. Hong et al., Vacuum Integrated "Fabrication of Buried Heterostructural Edge Emitting Laser Diodes"..., Mat. Res. Soc. Symp. Proc., vol. 300, pp. 189–196 (1993) (no month available).

K. D. Choquette et al., Vertical–Cavity Surface ..., IEEE Phot. Tech. Lett., vol. 5, No. 3, pp. 284–287 (1993) Mar. 1993.

J. Faist et al., Quantum Cascade Laser, Science, vol. 264, pp. 553–556 (1994) Apr. 1994.

F. Capasso et al., Infrared (4–11 $\mu$m) Quantum Cascade Lasers ..., Solid State Communcations, vol. 102, No. 2–3, pp. 231–236 (1997) (no month).

G. Scamarcio et al., High–Power Infrared(8–micrometer wavelength) Superlattice Lasers ..., Science, vol. 276, pp. 773–776 (May 1997).

J. Faist et al., Distributed feedback Quantum Cascade Lasers..., Appl. Phys. Lett., vol. 70, No. 20, pp. 2670–2672 (May 1997).

C. Gmachl et al., Complex–Coupled Quantum Cascade Distributed Feedback Laser ..., IEEE Phot. Tech. Lett., vol. 9, No. 8, pp. 1090–1092 (Aug. 1997).

K. Namjou et al., Sensitive absorption Spectroscopy With a Room Temperature Distributed Feedback Quantum Cascade Laser ..., Optics Letters, vol. 23, No. 3, pp. 219–221 (Feb. 1998).

Beck et al., Buried heterostructural quantum cascade lasers, Proceedings of SPIE, vol. 3284, pp. 231–236 (1998) Jan. 1998.

*Primary Examiner*—Rodney Bovernick
*Assistant Examiner*—Quyen P. Leung
*Attorney, Agent, or Firm*—Eugen E. Pacher

[57] ABSTRACT

A QC laser comprises first and second optical confinement (i.e., cladding) regions, and an In-based, Group III-V compound, QC active region disposed between the confinement regions. At least the first confinement region and the active region having the shape of an elongated mesa. An i-type InP layer covers the sidewalls to provide efficient heat transport and effective low loss mode confinement. A metal layer makes ohmic contact with the top surface of the mesa and a rectifying contact with the i-InP layer.

10 Claims, 3 Drawing Sheets

QUANTUM CASCADE LASER

FIELD OF THE INVENTION

This invention relates generally to semiconductor lasers and, more particularly, to quantum cascade (QC) lasers.

BACKGROUND OF THE INVENTION

As described by F. Capasso et al. in *Solid State Communications*, Vol. 102, No. 2–3, pp. 231–236 (1997) and by J. Faist et al. in *Science*, Vol. 264, pp. 553–556 (1994), which are incorporated herein by reference, a QC laser is based on intersubband transitions between excited states of coupled quantum wells and on resonant tunneling as the pumping mechanism. Unlike all other semiconductor lasers (e.g., diode lasers), the wavelength of the lasing emission of a QC laser is essentially determined by quantum confinement, i.e., by the thickness of the layers of the active region rather than by the bandgap of the active region material. As such it can be tailored over a very wide range using the same semiconductor material. For example, QC lasers with InAlAs/InGaAs active regions have operated at mid-infrared wavelengths in the 3.5 to 13 $\mu$m range. In diode lasers, on the contrary, the bandgap of the active region is the main factor in determining the lasing wavelength. Thus, to obtain lasing operation at comparable infrared wavelengths the prior art has largely resorted to the more temperature sensitive and more difficult-to-process lead salt materials system.

More specifically, diode lasers, including quantum well lasers, rely on transitions between energy bands in which conduction band electrons and valence band holes, injected into the active region through a forward-biased p-n junction, radiatively recombine across the bandgap. Thus, as noted above, the bandgap essentially determines the lasing wavelength. In contrast, the QC laser relies on only one type of carrier, i.e., it is a unipolar semiconductor laser in which electronic transitions between conduction band states arise from size quantization in the active region heterostructure.

In earlier QC lasers both the waveguide core (including the active region) and the waveguide cladding comprised ternary Group III-V compounds such as InAlAs and InGaAs grown by molecular beam epitaxy (MBE). In order to enhance heat removal during lasing operation, InP has been substituted for the InAlAs cladding material. See, J. Faist et al., *Appl*. However, these QC lasers were etched in the form of a mesa stripe in which the side walls of the active InAlAs/InGaAs region were usually covered by an insulating dielectric material (such as silicon nitride or silicon dioxide) with an overlaid top-contact metalization (which introduces loss). Neither of these materials is suitable for heat transport or for optical mode confinement. As a consequence, such designs tend to have threshold current densities that limit the optical output power that can be attained without damaging the laser.

Thus, a need remains in the QC laser art for a laser design that addresses the heat transport and mode confinement problem in a way that lowers the threshold current density and enables higher output power operation.

SUMMARY OF THE INVENTION

This need is addressed in accordance with one aspect of our invention, a QC laser comprising first and second optical confinement regions (i.e., claddings), and an In-based, Group III-V compound, QC active region disposed between the confinement regions, at least the first confinement region and the active region having the shape of an elongated mesa, the mesa having sidewalls and a top surface, characterized in that an i-InP layer covers the sidewalls, and a metal layer makes ohmic contact with the top surface and a rectifying contact with the i-InP layer.

The i-InP layer provides both efficient heat transport and effective low loss mode confinement, and thus enables our improved QC laser to operate at lower threshold current densities and higher output powers than heretofore.

The term QC active region includes a multiplicity of essentially identical radiative transition (RT) regions and a multiplicity of injection/relaxation (I/R) regions interleaved with the RT regions. The RT regions, which include quantum well regions interleaved with barrier regions, as well as the I/R regions each comprise a multiplicity of semiconductor layers. At least some of the layers of each I/R region are doped, but in any case the I/R regions as well as the RT regions are unipolar. In addition, the term QC active region is intended to embrace both diagonal lasing transitions as well as vertical lasing transitions. Diagonal transitions involve radiative transitions between upper and lower laser energy levels or states where the wave functions (the moduli squared) corresponding to the levels are substantially localized in different quantum wells of the same RT region. See, U.S. Pat. No. 5,457,709 which is incorporated herein by reference. On the other hand, in the case of vertical transitions the excited and lower energy states are both substantially in the same quantum well of a single RT region. See, U.S. Pat. No. 5,509,025 which is also incorporated herein by reference. Both types of lasing transitions are also described in the article by F. Capasso et al., supra. This article, as well as the '025 patent, point out that the I/R regions of a vertical transition QC laser may include minibands and a minigap between the minibands to form an effective Bragg reflector for electrons in the excited state and to ensure swift electron escape from the lower states.

Yet another intersubband laser, known as a superlattice laser, can also benefit from implementation in accordance with our invention. In a superlattice laser the wavefunctions of the laser levels are spread over a multiplicity of quantum wells within each RT region. Laser action is achieved through unipolar injection by inter miniband tunneling. See, G. Scamarcio et al., *Science*, Vol. 276, pp. 773–776 (May 1997), which is incorporated herein by reference.

BRIEF DESCRIPTION OF THE DRAWINGS

Our invention, together with its various features and advantages, can be readily understood from the following more detailed description taken in conjunction with the accompanying drawings, in which.

Figure 1:
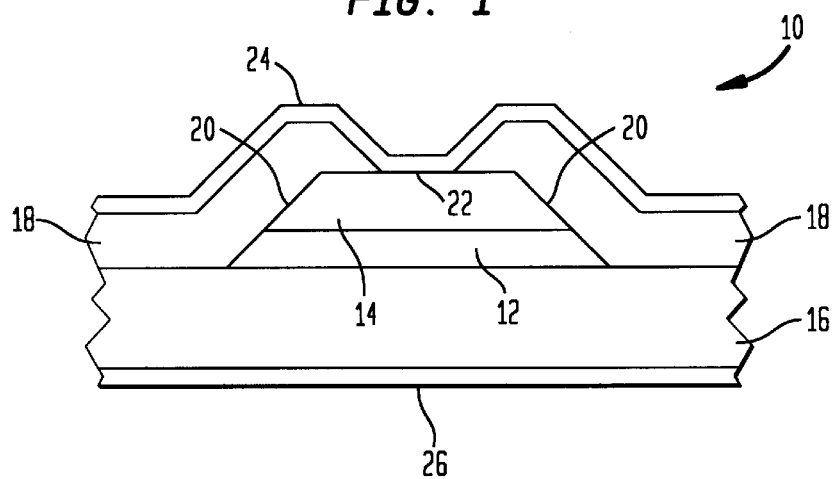
FIG. 1 is a schematic, cross-sectional view of a QC laser in accordance with one embodiment of our invention.

In the interest of clarity and simplicity, FIG. 1 has not been drawn to scale. In addition, when describing physical or optical dimensions, the symbol A stands for Angstroms, whereas when describing electric current, it stands for Amperes.

DETAILED DESCRIPTION OF THE INVENTION

With reference now to FIG. 1, a QC laser 10 in accordance with one aspect of our invention comprises a QC active region, as defined earlier, disposed between an upper cladding region 14 and a lower cladding region 16. At least the upper cladding region 14 and the active region 12 have the shape of an elongated mesa. The mesa has sidewalls 20 and a top surface 22. An i-type InP layer 18 is formed on the side walls 20 to provide efficient heat transport and effective low loss optical mode confinement. An opening is formed in the portion of layer 18 which overlaps the top surface 22 to enable metal layer 24 to make ohmic contact thereto. Importantly, however, layer 24 also makes a rectifying (e.g., Schottky barrier) contact with layer 18 so as to reduce leakage current around the active region. Another metal layer 26 forms an ohmic contact to the lower confinement region 16.

The i-type InP layer 18 is unintentionally doped and, when grown by MBE, typically has a carrier concentration of about $10^{15}$ cm$^{-3}$ due to background doping. The background carrier type is preferably the same as that of the unipolar QC active region. For example, lasing in the active region typically involves only electron transitions, which means that the background doping should preferably come from donors, not acceptors.

A suitable thickness for layer 18 is in the range of 1 to 3 $\mu$m and depends on the need to cover at least the side walls of the active region.

EXAMPLES

The following examples describe QC lasers in accordance with two embodiments of our invention. In one embodiment (D2282BH) the laser has an n-InAlAs top cladding layer and an i-InP heat transport/mode confinement layer 18, in the other embodiment (D2287BH) the laser has an n-InP top cladding layer and an i-InP heat transport/mode confinement layer. The inventive lasers D2282BH and D2287BH are compared to reference lasers D2282Ref and described in Table I; that of D2287 in Table II. In each example, the various materials, dimensions, dopants, doping concentrations, process steps, and operating conditions are provided by way of illustration only and, unless otherwise expressly stated, are not intended to limit the scope of the invention.

TABLE I

| D2282 Composition | Doping (n-type; cm$^{-3}$) | Thickness (nm) |
|---|---|---|
| InGaAs | $1 \times 10^{20}$ | 10 |
| Digitally graded | $7 \times 10^{18}$ | 30 |
| InAlAs | $7 \times 10^{18}$ | 1200 |
| InAlAs | $3 \times 10^{17}$ | 600 |
| InAlAs | $2 \times 10^{17}$ | 700 |
| Digitally graded | $2 \times 10^{17}$ | 30 |
| InGaAs (upper) | $1 \times 10^{17}$ | 350 |
| Digitally graded | $2 \times 10^{17}$ | 25 |
| Active region (25x) | — | 1130 |
| Digitally graded | $2 \times 10^{17}$ | 12 |
| InGaAs (lower) | $1 \times 10^{17}$ | 350 |
| Digitally graded | $3 \times 10^{17}$ | 25 |
| InP substrate | $1 \times 10^{18}$ | — |

QC laser D2282 was designed for an emission (i.e., lasing) wavelength of about 5.4 $\mu$m and was grown lattice matched to the n-InP substrate in two MBE growth cycles. In the first cycle, both the waveguide core and cladding layers were formed. The core comprised a thin (350 nm thick) lower InGaAs layer, an active region having 25 repeat units of RT and I/R regions, and an upper InGaAs layer (also 350 nm thick). Each of the InGaAs layers was bounded at the top and bottom by digitally graded InAlAs/InGaAs layers of the general type described in the '025 patent, supra. Each repeat unit comprised a three-well, vertical RT region and an n-type electron I/R region. The layer thicknesses from top to bottom of one repeat unit (in nanometers) were: (5)/1/(1.5)/4.7/(2.2)/4/(3)/2.3/(2.2)/2.2/(2.2)/2/(2)/2/(2.3)/ 1.9/(2.8)/1.9. The thicknesses in parenthesis refer to the barrier layers of $In_{0.52}Al_{0.48}As$, and the underlined three thicknesses correspond to InGaAs layers doped with Si to about $2 \times 10^{17}$ cm$^{-3}$. In the above sequence, the first barrier thickness pertains to the injection barrier, and the following six thicknesses pertain to the RT region of the repeat unit. The lower and upper InGaAs layers serve to improve confinement of the optical transverse mode. The upper waveguide cladding comprised three relatively thick InAlAs layers, a digitally graded InGaAs/InAlAs layer and the topmost InGaAs layer.

After completion of the first MBE cycle, the laser wafers were processed by conventional contact lithography and wet chemical etching into elongated mesas (i.e., mesa ridge waveguides) of width 5–13 $\mu$m and height 6–7 $\mu$m. The wafers were then loaded into a second MBE system fitted with an in-situ etching chamber. As a result of exposure to the atmosphere, tenacious native oxides formed on the ternary compound (especially InAlAs) layers exposed at the mesa sidewalls. These oxides prevent the regrowth of single crystalline InP on the ternary layers without an appropriate in-situ cleaning procedure prior to regrowth. Accordingly, we removed these oxides by heating the wafers to 200° C. in a $10^{-9}$ torr vacuum and by subjecting the regrowth surfaces to chlorine gas flow for about 1 min. The etch rate was about 0.1 $\mu$m/min.

After de-oxidation the wafers were cooled and transferred to a second MBE chamber, heated to about 460° C. in $P_2$ flux for 10 min. before the second MBE growth cycle was initiated. In this second growth cycle, the i-InP heat transport/mode confinement layer 18 was grown over the previously cleaned surface of the mesa. This layer was unintentionally doped and about 3 $\mu$m thick. After completion of the second MBE growth cycle, a portion of layer 18 on top of the mesa was selectively removed by wet chemical etching. Then, a non-alloyed Ti/Au layer 24 and a non-alloyed Ge/Au/Ag/Au layer 26 were deposited by electron beam evaporation. Layer 26 formed an ohmic contact to the substrate; layer 24 formed an ohmic contact to the n-InGaAs cladding at the top of the mesa, but formed a Schottky barrier contact to the i-InP layer 18.

The wafers were cleaved into bars of length 0.75–1.875 mm with the facets left uncoated and were mounted, substrate down, on a temperature controlled (10–320° K) cold head of a He flow cryostat. Measurements were made, with the lasers driven by 50 ns current pulses having a 5 kHz repetition rate. The optical power was measured using f/0.8 optics and a calibrated room temperature HgCdTe detector.

Figure 2A:
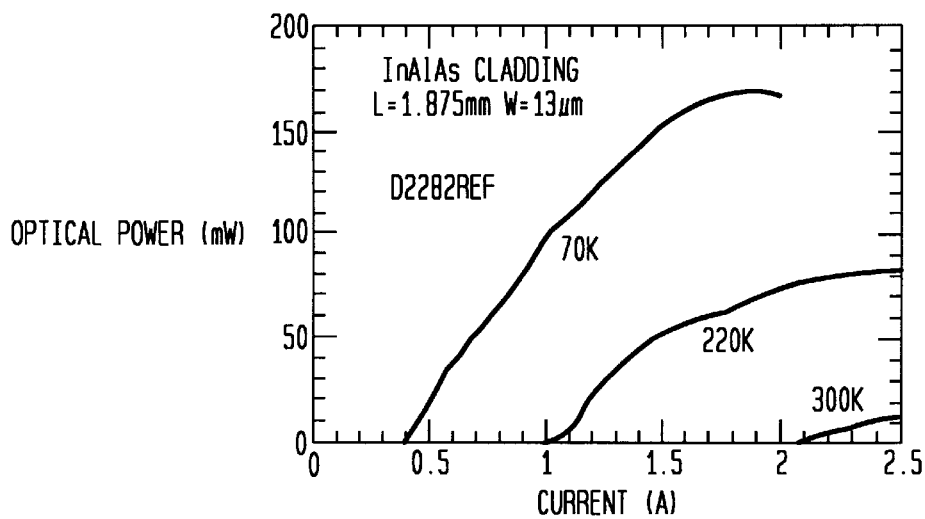
FIG. 2 is a set of graphs comparing the optical output power of a reference QC laser (D2282Ref having an InAlAs upper cladding layer but no i-InP heat transport/mode confinement layer; see FIG. 2A) with a QC laser in accordance with one embodiment of our invention (D2282BH having an n-InAlAs upper cladding layer and an i-InP heat transport/mode confinement layer; see FIG. 2B)
Figure 2B:
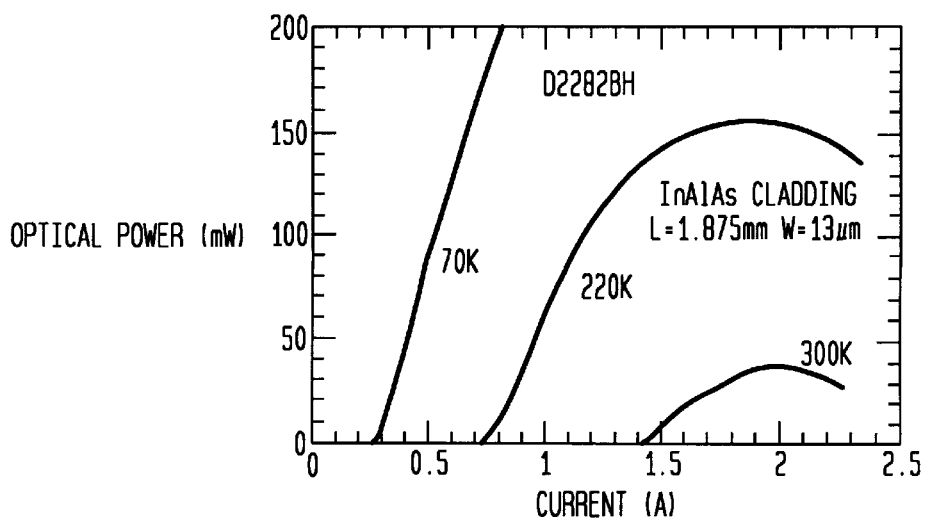

The results of optical power measurement shown in FIG. 2 are for lasers that were 1.875 mm long and had mesas 13 μm wide as measured in the middle of the active region. The performance of the reference lasers D2282Ref (FIG. 2A) is typical of state-of-the-art 5 μm wavelength QC lasers with an InAlAs top cladding. In contrast, the performance of our inventive lasers D2282BH exhibits higher slope efficiency, higher optical output power and lower threshold at all temperatures. For example, at 300° K the slope efficiency increased from 28 mW/A for the reference laser to 81 mW/A for our inventive lasers with a concomitant increase of the maximum optical power from about 10 mW to 40 mW. Likewise, the threshold current density comparison is shown in FIG. 4A. The data between 150° K. and 300° K. can be described by the usual exponential behavior $J_{th} \sim \exp(T/T_0)$ with $T_0=123°$ K. for the reference lasers and $T_0=130°$ K. for our inventive lasers. In addition, our inventive lasers exhibited lower threshold current densities and higher $T_0$ over the entire temperature range.

TABLE II

| D2287 Composition | Doping (n-type; cm$^{-3}$) | Thickness (nm) |
| --- | --- | --- |
| InP | $7 \times 10^{18}$ | 900 |
| InP | $2 \times 10^{17}$ | 1300 |
| InP | $5 \times 10^{17}$ | 20 |
| Digitally graded | $3 \times 10^{17}$ | 25 |
| InGaAs (upper) | $1.5 \times 10^{17}$ | 300 |
| Digitally graded | $1.6 \times 10^{17}$ | 25 |
| Active region (25x) | — | 1125 |
| Digitally graded | $1.6 \times 10^{17}$ | 25 |
| InGaAs (lower) | $1.5 \times 10^{17}$ | 250 |
| Digitally graded | $3 \times 10^{17}$ | 25 |
| InP substrate | $2 \times 10^{17}$ | — |

QC laser D2287 was also designed for operation at 5.4 μm. Like D2282, lasers D2287 had an i-InP heat transport/mode confinement layer, but unlike D2282 it had an n-InP top cladding layer rather than an n-InGaAs top cladding layer in order to further improve heat dissipation.

Fabrication of this laser involved three MBE growth cycles. In the first growth cycle the core region was formed. It comprised a thin (250 nm thick) lower InGaAs layer, an active region having 25 repeat units of the type previously described for D2282, and an upper (300 nm thick) InGaAs layer. As before, the upper and lower InGaAs layers were each bounded by digitally graded InAlAs/InGaAs layers. After completion of the first MBE growth cycle, the wafers were then arsenic capped to protect the regrowth surface and transferred to a second MBE chamber equipped with a solid phosphorous source. In the second MBE growth cycle, the three n-InP cladding layers were grown directly on the waveguide core.

After completion of the second MBE growth cycle, the wafers were processed using conventional contact lithography and wet chemical etching into mesa ridge waveguides as with D2282. The wafers were then loaded into the third MBE system fitted with the in-situ etching chamber. Subsequently, the removal of native oxides from the growth surface, the growth of the i-InP layer, the laser processing and mounting and the measurements were made substantially as described above for D2282. The D2287 lasers were, however, slightly longer (2.25 mm vs 1.875 mm) but of the same mesa width (13 μm) as the D2282 lasers.

Figure 3A:
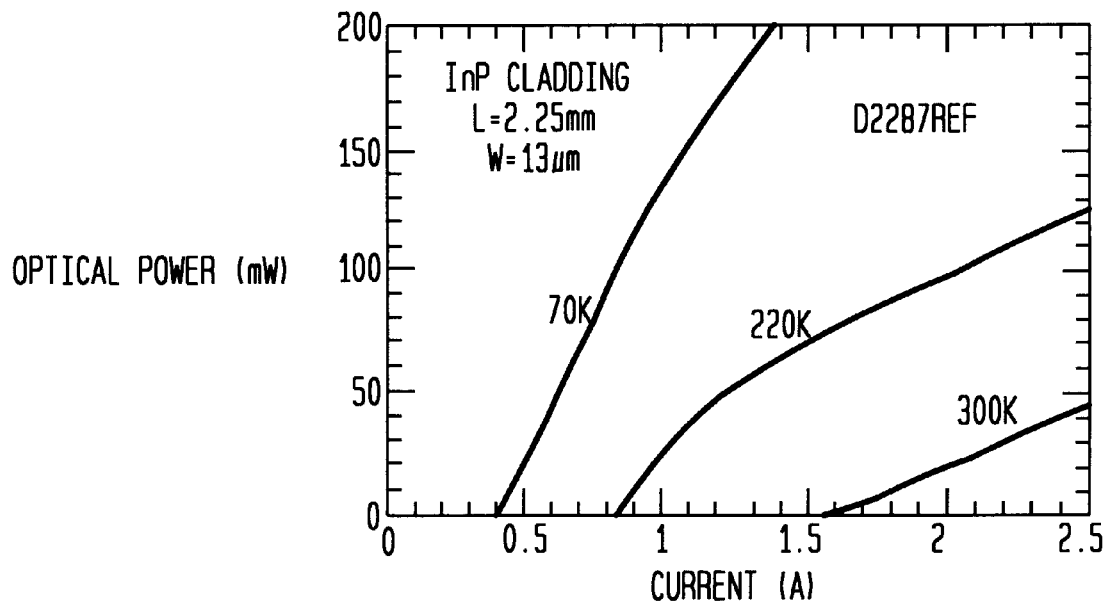
FIG. 3 is a set of graphs comparing the optical output power of a reference QC laser (D2287Ref having an InP upper cladding layer but no i-InP heat transport/mode confinement layer; see FIG. 3A) with a QC laser in accordance with another embodiment of our invention (D2287BH having an n-InP upper cladding layer and an i-InP heat transport/mode confinement layer; see FIG. 3B)
Figure 3B:
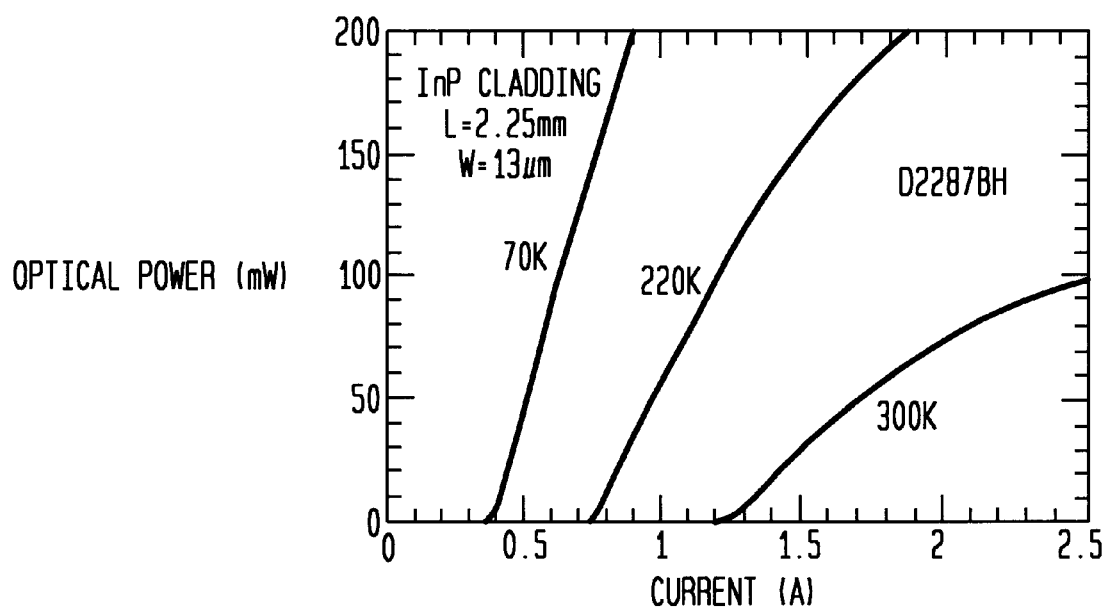
Figure 4B:
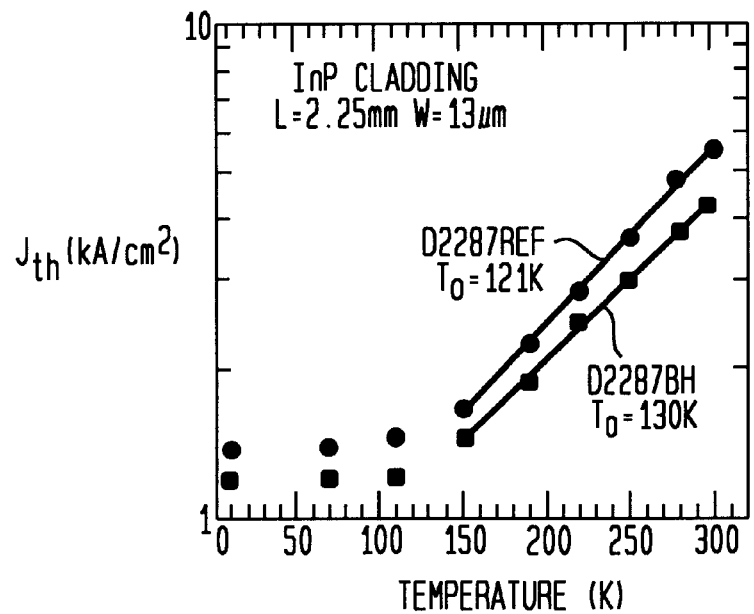
FIG. 4 is a set of graphs comparing the temperature dependence of the threshold current density $J_{th}$ of the same lasers described above.
FIG. 4A compares $J_{th}$ for D2282Ref and D2282BH, and FIG. 4B compares $J_{th}$ for D2287Ref and D2287BH.
Figure 4A:
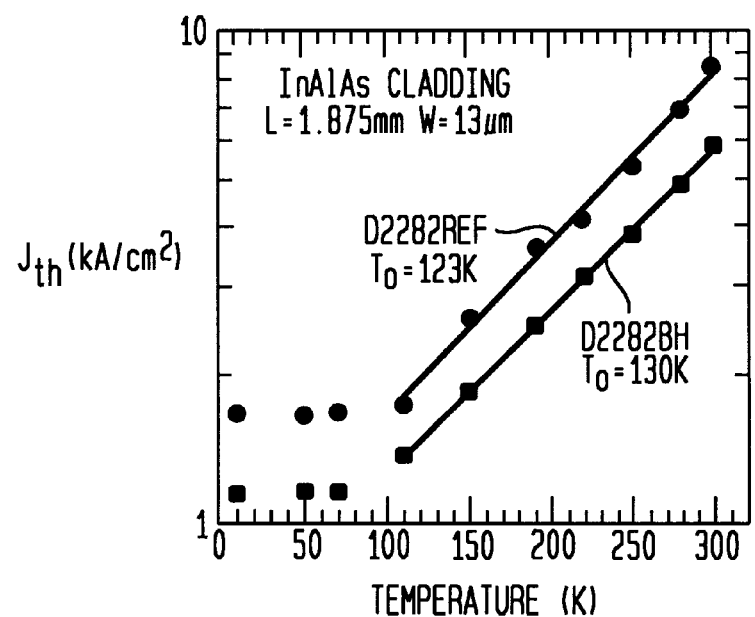

The results of the measurement are shown in FIGS. 3 and 4B. Similar to the results for D2282, the D2287BH lasers exhibited a systematic improvement when compared to the D2287Ref lasers. The slope efficiency at room temperature more than doubled from 50 mW/A to 113 mW/A, and the maximum output power likewise more than doubled from 40 mW to 106 mW. On the other hand, $T_0=121°$ K. for the reference lasers, but $T_0=130°$ K. for our inventive lasers. In addition, the threshold current density at room temperature (300° K.) of our D2287BH lasers was 4.2 kA/cm$^2$, significantly lower than our previously published results in Faist et al., *Appl. Phys. Lett., supra*.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the second embodiment of our invention (D2287) can be accordance with these principles by those skilled in the art without departing from the spirit and scope of the invention. In particular, the second embodiment of our invention (D2287) can be readily adapted to accommodate a distributed feedback (DFB) grating. To do so, in the Table I embodiment, for example, the DFB grating would then be formed by conventional techniques in the topmost InGaAs layer or in a combination of the InGaAs layer and one or more of the underlying InAlAs layers. Then, illustratively, a metal layer (which could also serve as the top contact) would be formed over the grating to provide good index contrast in the imaginary part of the refractive index (loss). In the Table II embodiment, on the other hand, the DFB grating could be formed in the upper InGaAs layer with the overlying InP layers providing the requisite index contrast. In this case, the digitally graded layer between the upper InGaAs layer and the InP layers may either be omitted or etched away in the region of the grating.

What is claimed is:

1. A quantum cascade (QC) semiconductor laser comprising
    a core region including a QC active region which comprises a multiplicity of unipolar radiative transition regions interleaved with unipolar injection/relaxation regions,
    upper and lower cladding regions bounding said core region,
    said core and cladding regions comprising In-based Group III-V compound semiconductor materials,
    at least said upper cladding region and said active region having the shape of an elongated mesa having sidewalls and a top surface, characterized in that
        an i-InP layer covers said mesa and has an opening therein exposing at least a portion of said top surface, and
        a metal layer forms an ohmic contact to said portion of said top surface and a rectifying contact to said i-InP layer.

2. The invention of claim 1 wherein said QC active region is bounded above and below by a pair of digitally graded regions and a ternary layer disposed between said graded regions.

3. The invention of claim 2 wherein said QC active region and said graded regions comprise InAlAs/InGaAs layers, and said ternary layer comprises InGaAs.

4. The invention of claim 3 wherein said upper cladding region comprises a multiplicity of n-InAlAs layers, an n-InGaAs layer, and a digitally graded region disposed between said InAlAs layers and said InGaAs layer.

5. The invention of claim 3 wherein said upper cladding region comprises a multiplicity of n-InP layers.

6. The invention of claim 3 wherein said lower cladding region comprises an n-InP substrate.

7. A quantum cascade (QC) laser comprising a lower cladding region comprising an n-InP substrate, a core region comprising In-based Group III-V compound layers including
   a first digitally graded region disposed on said lower cladding region,
   a lower ternary layer disposed on said first graded region,
   a second digitally graded region disposed on said lower layer,
   a QC active region disposed on said second graded region,
   a third digitally graded region disposed on said active region,
   an upper ternary layer disposed on said third graded region, and
   a fourth digitally graded region disposed on said upper layer, an upper cladding region comprising a multiplicity of In-based Group III-V compound layers disposed on said core region, at least said core region and said upper cladding region having the shape of an elongated mesa which has sidewalls and a top surface, an i-InP layer contacting said sidewalls so as to cover at least said active region and having an opening exposing at least a portion of said top surface, a first metal layer disposed on said i-InP layer and said portion so as to form an ohmic contact with said portion and a rectifying contact with said i-InP layer, and a second metal layer making an ohmic contact to said substrate.

8. The invention of claim 7 wherein said upper cladding region comprises a multiplicity of InAlAs layers, an InGaAs layer, and a fifth digitally graded region disposed therebetween.

9. The invention of claim 7 wherein said upper cladding region comprises a multiplicity of n-InP layers.

10. The invention of claim 7 wherein said active region and said digitally graded regions comprise a multiplicity of InAlAs/InGaAs layers and said upper and lower ternary layers comprise InGaAs.

* * * * *